(12) United States Patent
Nakamura

(10) Patent No.: US 10,584,845 B2
(45) Date of Patent: Mar. 10, 2020

(54) LED LIGHTING APPARATUS

(71) Applicant: Shoichi Nakamura, Nagano-ken (JP)

(72) Inventor: Shoichi Nakamura, Nagano-ken (JP)

(73) Assignees: Shoichi Nakamura,
Higashichikuma-Gun, Nagano-Ken (JP);
ACP JAPAN CO., LTD., Tokyo (JP)

( * ) Notice: Subject to any disclaimer, the term of this patent is extended or adjusted under 35 U.S.C. 154(b) by 71 days.

(21) Appl. No.: 15/593,951

(22) Filed: May 12, 2017

(65) Prior Publication Data

US 2018/0328579 A1 Nov. 15, 2018

(51) Int. Cl.
| | |
|---|---|
| F21V 5/00 | (2018.01) |
| F21V 29/67 | (2015.01) |
| H01L 33/58 | (2010.01) |
| F21Y 115/10 | (2016.01) |
| H01L 33/64 | (2010.01) |
| F21V 29/51 | (2015.01) |

(52) U.S. Cl.
CPC .............. *F21V 5/008* (2013.01); *F21V 29/51* (2015.01); *F21V 29/677* (2015.01); *H01L 33/58* (2013.01); *F21Y 2115/10* (2016.08); *H01L 33/644* (2013.01)

(58) Field of Classification Search
CPC .......... F21V 29/70; F21V 29/80; F21V 29/60; F21V 17/12; F21V 5/008; F21V 29/74; F21Y 2115/10; H01L 27/15; H01L 33/486

See application file for complete search history.

(56) References Cited

U.S. PATENT DOCUMENTS

| | | | | | |
|---|---|---|---|---|---|
| 5,274,535 | A | * | 12/1993 | Gonser | ..................... F21V 9/00 362/268 |
| D405,901 | S | * | 2/1999 | Feinbloom | ..................... D26/39 |
| 6,461,024 | B1 | * | 10/2002 | Becker | ..................... F21V 5/008 362/331 |
| 7,654,675 | B2 | * | 2/2010 | Ko | .......................... G03B 21/16 353/52 |
| 8,662,709 | B2 | * | 3/2014 | Chang | ..................... F21V 5/008 362/268 |
| 10,247,384 | B1 | * | 4/2019 | Feinbloom | .............. F21V 5/008 |
| 2007/0115656 | A1 | * | 5/2007 | Chou | ........................ F21V 5/04 362/228 |

(Continued)

FOREIGN PATENT DOCUMENTS

| | | |
|---|---|---|
| JP | 2007-042755 A | 2/2007 |
| JP | 2011-165351 A | 8/2011 |

*Primary Examiner* — Tsion Tumebo
(74) *Attorney, Agent, or Firm* — Manabu Kanesaka

(57) ABSTRACT

To effective cool inside a lens casing in an LED lighting apparatus that hermetically houses LED elements in the lens casing, the present LED lighting apparatus includes a tubular lens casing having a first end face at which lighting lenses are provided and a second end face, a substrate on which LED elements are mounted, and a base part provided on the second end face side of the lens casing. The base part has a concave part housing therein the substrate. The lens casing is coupled to the base part by a coupling part with the second end face thereof fitted to the concave part, thereby sealing the internal space of the lens casing. The base part has heat radiating columns formed to protrude therefrom to an outside space, and the heat radiating columns radiate heat that the LED elements generate in the internal space through heat exchange with air.

8 Claims, 8 Drawing Sheets

(56) References Cited

U.S. PATENT DOCUMENTS

| | | | | |
|---|---|---|---|---|
| 2007/0236935 | A1* | 10/2007 | Wang | F21K 9/00 |
| | | | | 362/294 |
| 2008/0316736 | A1* | 12/2008 | Hunnewell | A45C 15/06 |
| | | | | 362/187 |
| 2009/0002946 | A1* | 1/2009 | Horng | F21V 29/02 |
| | | | | 361/697 |
| 2009/0231699 | A1* | 9/2009 | Nakamura | G02B 7/002 |
| | | | | 359/481 |
| 2009/0251901 | A1* | 10/2009 | Kuo | F21K 9/00 |
| | | | | 362/294 |
| 2011/0181167 | A1* | 7/2011 | Cho | F21V 5/04 |
| | | | | 313/46 |
| 2011/0317428 | A1* | 12/2011 | Paik | F21V 19/0055 |
| | | | | 362/294 |
| 2014/0293588 | A1* | 10/2014 | Chang | F21V 21/084 |
| | | | | 362/103 |
| 2017/0284648 | A1* | 10/2017 | Nakamura | F21V 29/503 |

* cited by examiner

LED LIGHTING APPARATUS

BACKGROUND OF THE INVENTION

Field of the Invention

The present invention relates to a small-sized wearable LED lighting apparatus.

Description of the Related Art

Conventionally, various types of lighting apparatuses using high-efficiency and long-life LED elements have been put into practical use. However, in such an apparatus, when the temperature inside of the main body casing becomes high because of heat generated from the LED elements, LED light emission efficiency is degraded, which may cause reduction in optical output of the lighting apparatus or reduction in the lifetime of the LED elements.

Therefore, in order to cool the LED elements, the conventional LED lighting apparatus is provided with a plurality of fins on the back surface of a substrate on which the LED elements are mounted (see Patent Document 1). Further, there is also known an LED lighting apparatus that actively cools LED elements using a fan (see Patent Document 2).

PRIOR ART DOCUMENT

Patent Document

[Patent Document 1] Japanese Patent Application Publication No. 2007-042755
[Patent Document 2] Japanese Patent Application Publication No. 2011-165351

Among the various lighting apparatuses using LED elements, there are known small-sized LED lighting apparatuses which are fitted to a wearing article such as glasses or a headband or clothes worn by a person to use. When such an apparatus is fitted to, e.g., the head part of a person, it can light along the line of sight direction of a person since a direction in which the face is turned and a light irradiation direction coincide with each other and is thus used as an optimum apparatus for lighting the hands of a working person in a spot.

However, such wearable LED lighting apparatuses are reduced in size and weight for wearing comfortableness, and thus the volume capacity of a lens casing for housing the LED elements is also reduced in size. It follows that the inner surface area of lens casing is small and, accordingly, the surface area of a lighting part is small, so that when dirt or water vapor enters the lens casing and adheres to the inside thereof to cloud the lighting surface, illuminance significantly reduces.

To prevent this, in small-sized LED lighting apparatuses, the LED elements are hermetically housed in the lens casing to thereby prevent entrance of dirt or water vapor. However, when a lens casing having a small volume capacity is sealed, temperature inside the lens casing rises in a short time, making the apparatuses unsuitable for long-time use. In addition, in most cases, a lens for use in irradiating LED light is made of resin for weight reduction, so that the lens may be easily damaged by heat.

Further, even when fins are provided on the back surface of a substrate on which the LED elements are mounted in order to suppress temperature rise inside the lens casing, heat exchange with the outside cannot be performed in a sealed space. Furthermore, in the sealed space, forced cooling by outside air cannot be performed even when the fan is provided.

SUMMARY OF THE INVENTION

The object of the present invention is therefore to achieve effective cooling inside the lens casing in an LED lighting apparatus that hermetically houses the LED elements in the lens casing.

To solve the above problem, an LED lighting apparatus according to the present invention includes a tubular lens casing that has a first end face at which lighting lenses are provided and a second end face, a substrate on which LED elements are mounted, a base part provided on the second end face side of the lens casing, a concave part formed in the base part so as to house the substrate, a coupling part that holds a coupling state between the lens casing and the base part by fitting the lens casing to the concave part at the second end face to seal the internal space of the lens casing, and heat radiating columns formed so as to protrude from the base part to an outside space.

With the above configuration, heat that the LED elements housed in the concave part emit is effectively transmitted to the base part and then radiated to an outside space through heat exchange between the heat radiating columns and air. As a result, high radiation performance of heat generated in a sealed internal space to an outside space can be ensured.

In this configuration, when the substrate is fixed to the bottom surface of the concave part using screws, the heat generated from the LED elements is transmitted to the base part through the screws. Further, when the leading ends of the screws are made to penetrate through the bottom surface of the concave part and protrude from the back surface of the base part, heat exchange with air can also be performed by the protruding parts of the screws.

The heat radiating columns may be used for supporting a fan that forms an air path in the outside space. This not only promotes heat exchange between the heat radiating columns and air, but also simplifies the apparatus structure.

As another example, a heat pipe may be formed so as to protrude from a terminal part of the LED elements in the base part to the outside space. Further, fins may be fitted to the heat pipe. In addition, a fan may be provided to form an air path to thereby perform heat exchange more effectively.

As still another example, a wire pipe through inside of which a lead wire to be connected to the LED elements passes may be made to protrude from the base part to the outside space.

According to the present invention, the concave part is formed in the base part for sealing the lens casing, and the substrate on which the LED elements are mounted is housed in the concave part, whereby heat generated from the LED elements is effectively transmitted to the base part. Then, the heat radiation columns, heat pipe, or wire pipe formed so as to protrude outward from the back surface of the base part performs heat exchange with air, making it possible to effectively cool the inside of the lens casing, which realizes an LED lighting apparatus with high durability.

DESCRIPTION OF THE PREFERRED EMBODIMENTS

Hereinafter, embodiments of the present invention will be described according to the accompanying drawings.

First Embodiment

Figure 1:
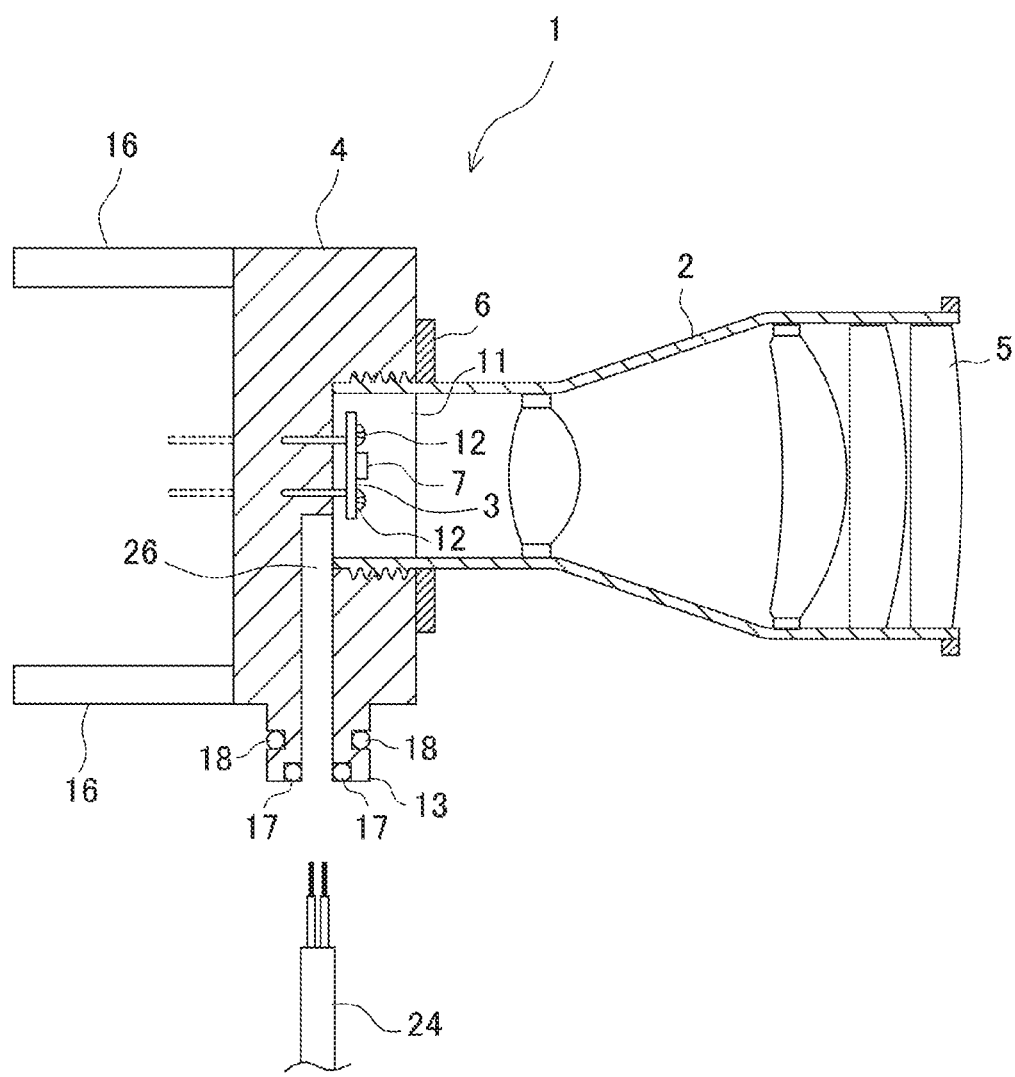
FIG. 1 is a side cross-sectional view of an LED lighting apparatus according to a first embodiment of the present invention.
Figure 2:
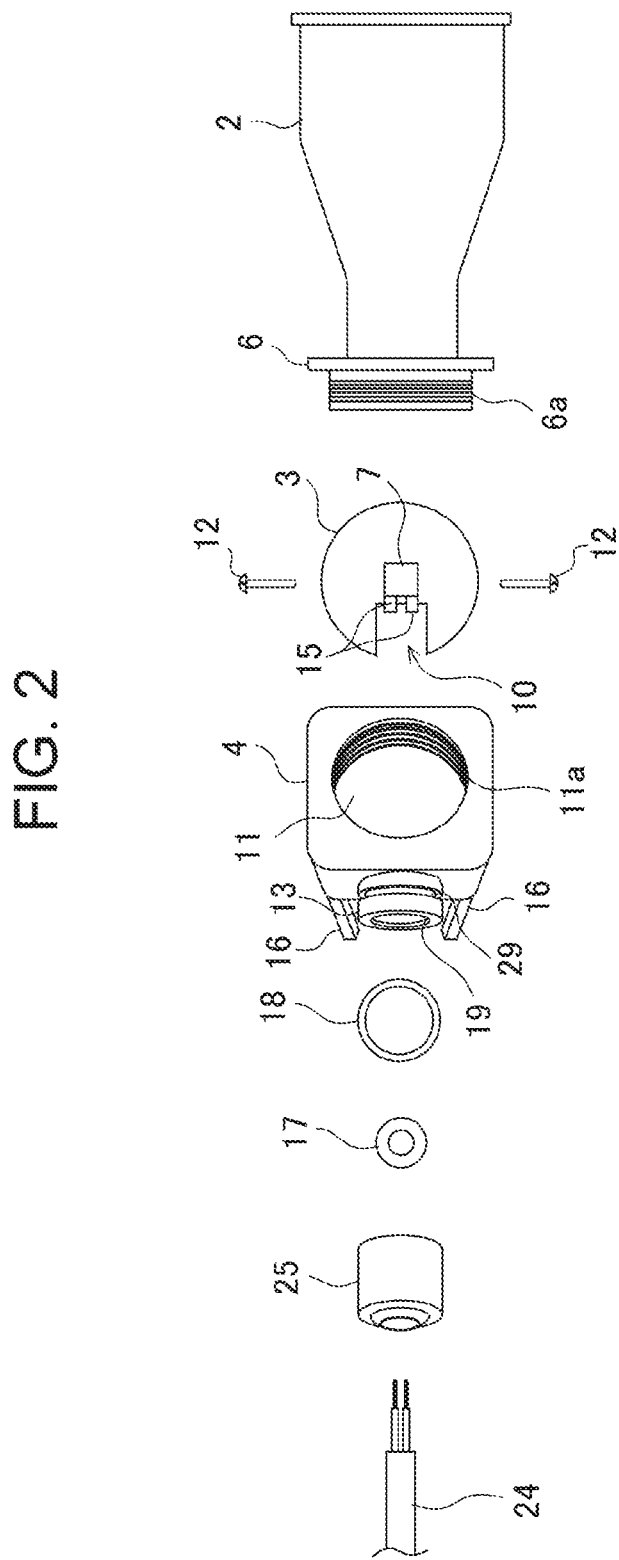
FIG. 2 is an exploded view of the LED lighting apparatus according to the first embodiment of the present invention.

FIG. 1 is a side cross-sectional view of a wearable LED lighting apparatus 1 that irradiates an irradiation object with light in a state being fitted to the body of an operator. The LED lighting apparatus 1 is constituted by assembling components illustrated in FIG. 2.

A lens casing 2 is a substantially truncated cone-shaped tube and incorporates a lens system 5 composed of a plurality of concaved lenses for irradiating an object with light in a spot. The lens casing 2 has, at its base end portion, a coupling part 6 for connecting to a base part 4, and a helically continued protruding part 6a is formed on the outer peripheral surface of the coupling part 6.

An LED holding part 3 is a circular substrate on which an LED package 7 including a plurality of LED elements are mounted by an adhesive and is made of resin having high heat conductivity or metal (including an alloy). In this case, the adhesive is preferably a silicone-based adhesive excellent in heat conductivity. The LED holding part 3 has, at a part of the circumference thereof, a substantially square cut part 10, and a lead 15 of the LED package 7 is drawn out to the cut part 10.

The base part 4 having a rectangular parallelepiped shape is made of resin having high heat conductivity has a cylindrical concave part 11 for housing the LED holding part 3. Further, the base part 4 has, at a side surface thereof, a receiving port 13 for receiving a harness 24 externally inserted into the base part 4. The harness 24 is introduced into the concave part 11 through a path 26 connecting the receiving port 13 and the concave part 11. The cut part 10 of the LED holding part 3 is disposed opposite to the exit side of the path 26, and lines from the harness 24 are connected to the lead 15 of the LED package 7 are connected by soldering. As a result, power is externally supplied to the LED package 7 through the harness 24, whereby the LED elements emit light. The base part 4 may be made of a metal material such as aluminum.

When the harness 24 is assembled to the base part 4, it is made to pass through a grommet 25 and hollow parts of respective O-rings 17 and 18 and inserted into the receiving port 13. Then, the grommet 25 is fitted over and fixed to the receiving port 13, whereby the O-ring 17 is locked to an annular receiving part 19 formed in the inner peripheral wall of the receiving port 13, and the O-ring 18 is fitted to a groove part 29 formed on the outer surface of the receiving port 13. As a result, the receiving port 13 is sealed with the harness 24 passed therethrough.

The LED holding part 3 is fixed to the bottom surface of the concave part 11 by a pair of screws 12. At this time, the LED holding part 3 may be disposed so as to contact the bottom surface of the concave part 11 or disposed spaced apart therefrom. In the present example, the LED holding part 3 and concave part 11 are fixed to each other by the screw 12 with a gap provided therebetween for facilitating connection between the lines of the harness 24 and the lead 15 of the LED package 7 at assembly.

In addition to fixing the LED holding part 3 to the concave part 11 of the base part 4, the screw 12 is intended to radiate heat generated from the LED package 7 to the outside. Particularly, when the fixing is made with a gap provided between the LED holding part 3 and the bottom surface of the concave part 11, the screw 12 directly transmits heat of the LED holding part 3 to the base part 4, so that a screw made of copper or tungsten is most suitably used as the screw 12. When the screw 12 is made of copper, silver plating is preferably applied to the surface thereof for corrosion prevention.

A groove 11a to be engaged with the protrusion 6a of the coupling part 6 is helically formed on the inner peripheral wall of the concave part 11. Thus, by fitting the coupling part 6 of the lens casing 2 into the concave part 11 and rotating the same, the lens casing 2 and the base part 4 are fastened to each other to be screw-coupled. Thus, the lens casing 2 is sealed by the O-rings 17 and 18 with the harness 24 passed through the receiving port 13, as described above, so that the inside of the lens casing 2 is kept in a sealed state, thereby preventing entrance of dirt or water vapor.

Heat radiating columns 16 protruding from the back surface of the base part 4 are formed at the four corners of the base part 4. Heat generated in the LED package 7 at lighting is transmitted from the LED holding part 3 to the base part 4. In the present example, a gap is provided between the LED holding part 3 and the base part 4, so that heat transfer from the LED holding part 3 to the base part is mainly achieved through the screw 12 directly contacting both the LED holding part 3 and the base part 4. The heat radiating columns 16 are each made of resin and integrally formed with the base part 4; alternatively, however, they may each be a column such as a metal bar or a pipe made of, e.g., copper that is assembled to the base part 4 as a member separately provided in addition to the base part 4.

Heat transmitted to the base part 4 is discharged to the atmosphere by heat exchange between the heat radiating columns 16 and air. As a result, the inside of the lens casing 2 is cooled by the heat radiating columns 16. As described above, by housing the LED holding part 3 on which the LED package 7 is mounted in the concave part 11 formed in the base part 4, heat generated in the LED package 7 is effectively transmitted to the base part 4 to be radiated from the heat radiating columns 16.

As described above, the base part 4 joined to the lens casing 2 to seal the same has the concave part 11 that houses therein the LED holding part 3 on which the LED package 7 is mounted and the heat radiating columns 16, allowing heat generated from the hermetically housed LED package 7 to be effectively radiated to the outside, which in turn allows the LED lighting apparatus 1 to perform long-time light irradiation. The heat exchange between air and the heat radiating columns 16 protruding from the base part 4 toward the outside space is higher in heat discharge effect than in a case where fins are provided on the back surface of the base part 4 to increase the surface area of the back surface, and it is more effective to provide the fins on the back surface of the base part 4 in addition to the formation of the heat radiating columns 16.

In order to further enhance the cooling effect, it is preferable to form the heat radiating columns 16 also at the center of the base part 4, i.e., the position directly facing the LED package 7. Further, the screw 12 transmits heat generated in the LED holding part 3 to the base part 4 in addition to fixing the LED holding part 3 to the bottom surface of the concave part 11 of the base part 4, so that, as denoted by the dashed line illustrated in FIG. 1, they preferably each have a threaded part long enough to penetrate through the bottom surface of the concave part 11 and protrude outward. Such a long screw having a threaded part protruding outward can perform heat exchange with air to the same extent as the heat radiating column 16, thereby further enhancing heat radiation effect.

Figure 3:
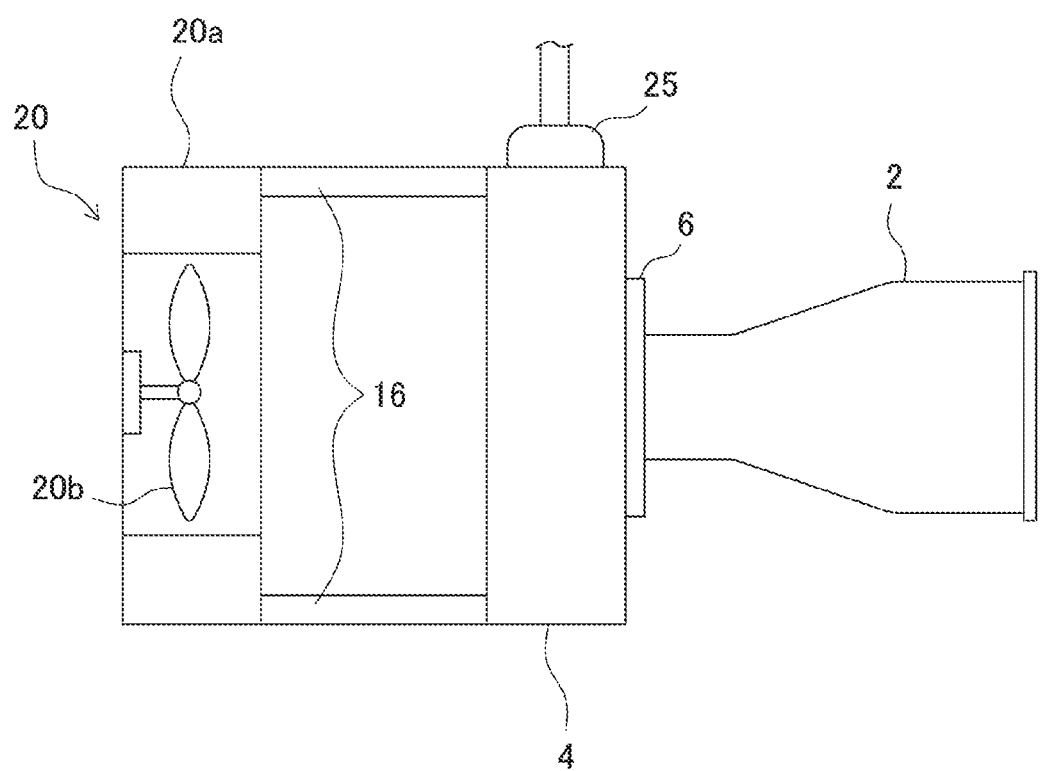
FIG. 3 is a side view of a modification obtained by adding a fan apparatus to the first embodiment of the present invention.

When cooling capacity is insufficient only with natural cooling by the heat radiating columns 16 because of large power consumption of the LED package, forced cooling may be performed by using a fan apparatus 20 illustrated in FIG. 3. In this case, the fan apparatus 20 can be supported by the heat radiating columns 16, so that the same structure can be used to realize both a lighting apparatus of a type including the fan and a lighting apparatus of a type not including the fan.

Figure 4:
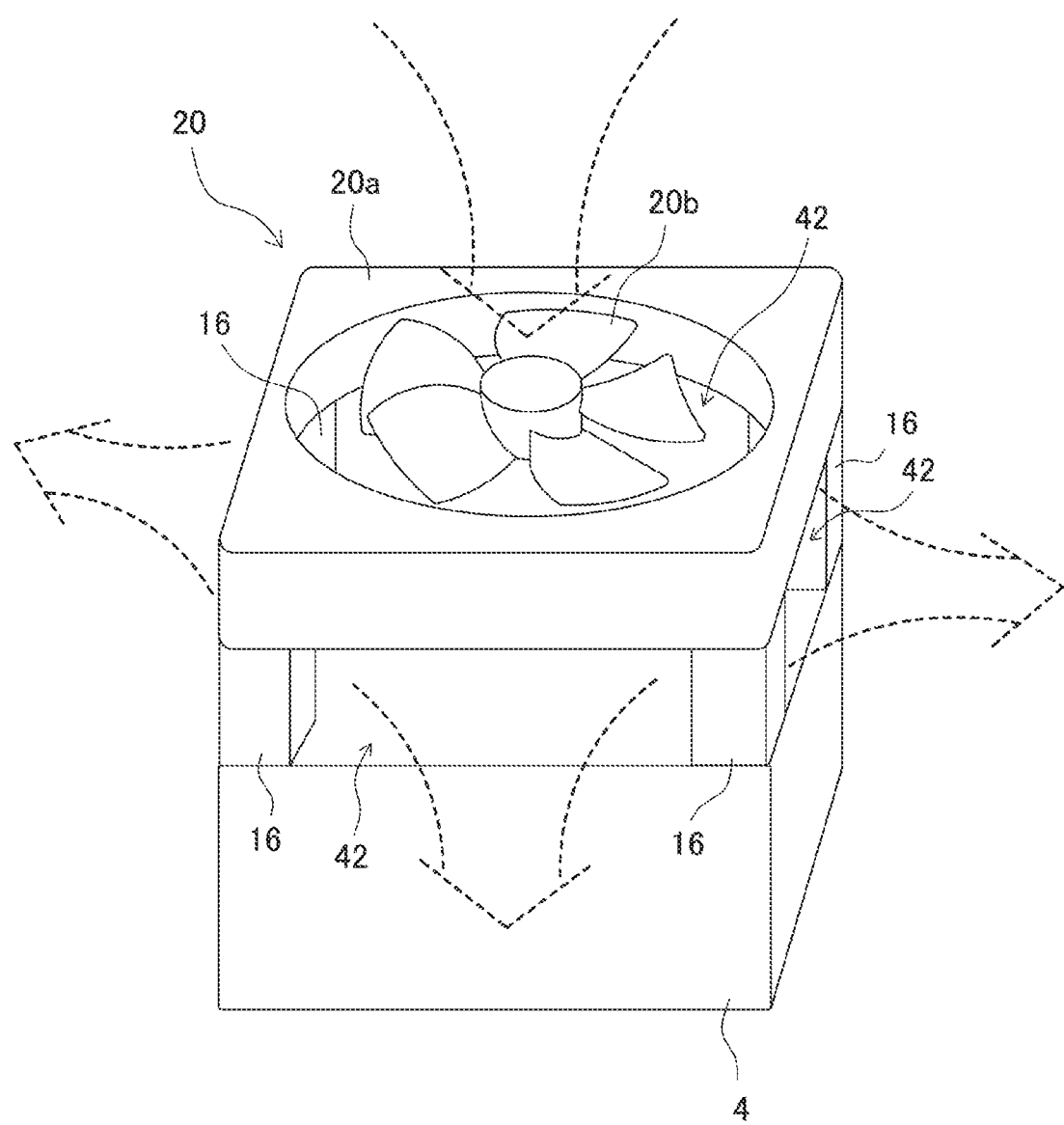
FIG. 4 is a view schematically illustrating an air flow in the configuration additionally including the fan apparatus.

As the fan apparatus 20 to be used in the small-sized LED lighting apparatus 1 of the present invention, a fan using a widely-used, compact brushless DC fan motor having a very small size (about 10 mm square or more and a thickness of about several mm) and a small capacity (about 3 V to 5 V) is most suitable. The fan apparatus 20 is an axial flow type fan and operates as illustrated in FIG. 4. That is, by rotation of an impeller 20b, the fan apparatus 20 takes in air in a frame 20a from outside and blows the air in the axial direction. Then, the blown air hits against an end face of the base part 4 and is exhausted outside in four directions through four window parts 42 each formed by adjacent heat radiating columns 16 as a pair of side frames and the sides of the respective frame 20a and base part 4 that face each other as upper and lower frames. As a result, the back surface of the base part 4 and the heat radiating columns 16 are effectively cooled by the air flow. Although not illustrated, the fan apparatus 20 is connected with a power supply line branched from the harness 24. Thus, in the LED lighting apparatus 1 provided with the fan apparatus 20, the harness 24 includes a power feed line for the fan apparatus 20 in addition to a power feed line and a ground line for the LED package 7. The air flow formed at this time may be opposite in direction to the air flow described above. That is, by rotation of an impeller 20b, the fan apparatus 20 may take in air through the four window parts 42 and exhaust the air outside through the frame 20a.

Figure 5:
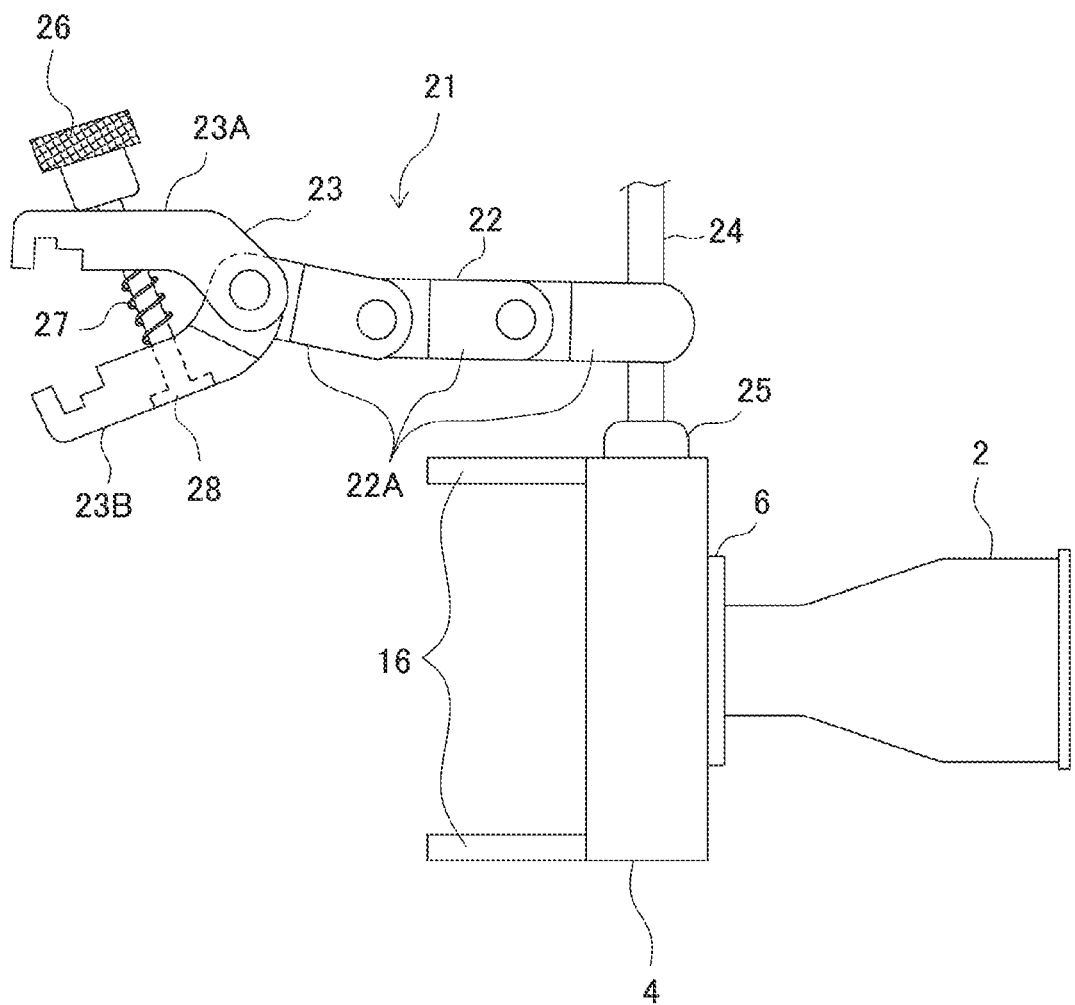
FIG. 5 is a side view of the LED lighting apparatus of FIG. 1 attached with an arm for fitting the lighting apparatus to the body of an operator.

As illustrated in FIG. 5, the LED lighting apparatus 1 has an arm 21 fixedly mounted to the harness 24. The arm 21 is used for fitting the LED lighting apparatus 1 to a wearing article such as glasses or a headband or clothes worn by an operator and includes a link mechanism part 22 and a holding part 23.

The link mechanism part 22 formed by turnably connecting three links 22A is turnably connected at one end thereof to the holding part 23 and turnably connected at the other end thereof to the harness 24. This allows each link 22A to turn with a degree of freedom, which in turns allows the lens casing 2 to move in the front-rear direction or up-down direction to separate from or come close to the holding part 23.

The holding part 23 includes a pair of holding pieces 23A and 23B whose one end portions are turnably coaxially supported, a screw 26, a spring 27, and a nut 28. The screw is fixedly mounted to the holding piece 23B, and the leading end of the screw shaft penetrates through the holding piece 23A to be fitted with the nut 28. The spring 27 is fitted around a part of the screw shaft between the holding pieces 23A and 23B.

The LED lighting apparatus 1 provided with the above arm 21 can be worn by a person by being fitted to, e.g., a glasses flame. In this case, a bridge part of the glasses frame that connects the left and right glasses is held between the holding pieces 23A and 23B, and the nut 28 is rotated in the fastening direction. As a result, the holding part 23 of the arm 21 securely holds the bridge part, and the LED lighting apparatus 1 is held by the glasses frame. When the nut 28 is loosened in this state, the holding pieces 23A and 23B are separated from each other, with the result that the holding part 23 releases the holding state of an attachment part. The LED lighting apparatus 1 can be fitted to a headband or a hat worn by a person by means of the holding part 23 in addition to the glasses frame.

Second Embodiment

Figure 6:
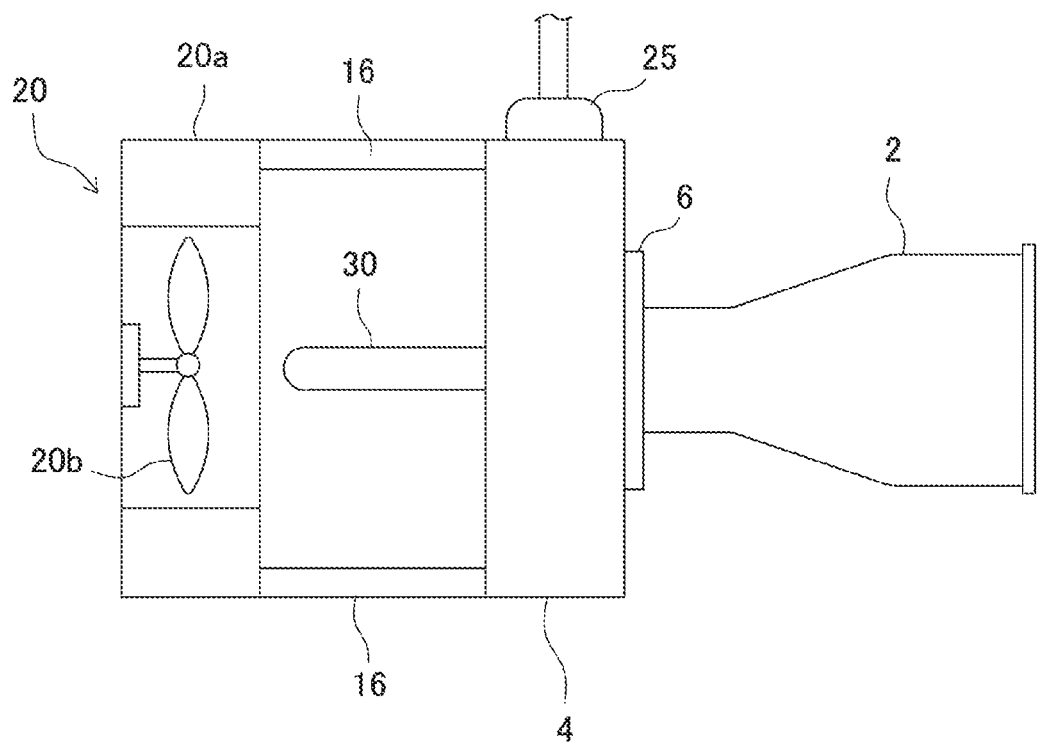
FIG. 6 is a side view of an LED lighting apparatus according to a second embodiment of the present invention.

While heat exchange is performed using the heat radiating columns 16 provided on the back surface of the base part 4 in the above first embodiment, a heat pipe may be used to perform heat exchange. As illustrated in FIG. 6, a heat pipe 30 is disposed so as to protrude from the center portion of the base part 4, i.e., the portion directly facing a terminal part of the LED elements in the LED package 7. The heat pipe 30 is a bar-like member inside of which a heat medium is encapsulated. One end of the heat pipe 30 contacts the base part 4 and serves as the heat absorbing side, and the other end thereof serves as the heat radiating side. That is, heat transmitted from the LED package 7 to the base part 4 is absorbed at the heat absorbing side, and the absorbed heat is radiated outside at the heat radiating side. While the thus configured heat pipe 30 may be provided in place of the heat radiating columns 16, the LED lighting apparatus 1 may include the heat pipe 30 together with the four heat radiating columns 16. FIG. 6 illustrates an embodiment in which the heat pipe 30, heat radiating columns 16, and a fan apparatus 20 are provided as heat radiating members. In this case as well, by rotation of an impeller 20b, the fan apparatus 20 takes in air in the frame 20a from outside and blows the air in the axial direction to form an air flow to be exhausted outside through the four window parts 42 and, at this time, the air flow is heat exchanged with the heat pipe 30 and heat radiating columns 16, thereby achieving more effective cooling.

Figure 7:
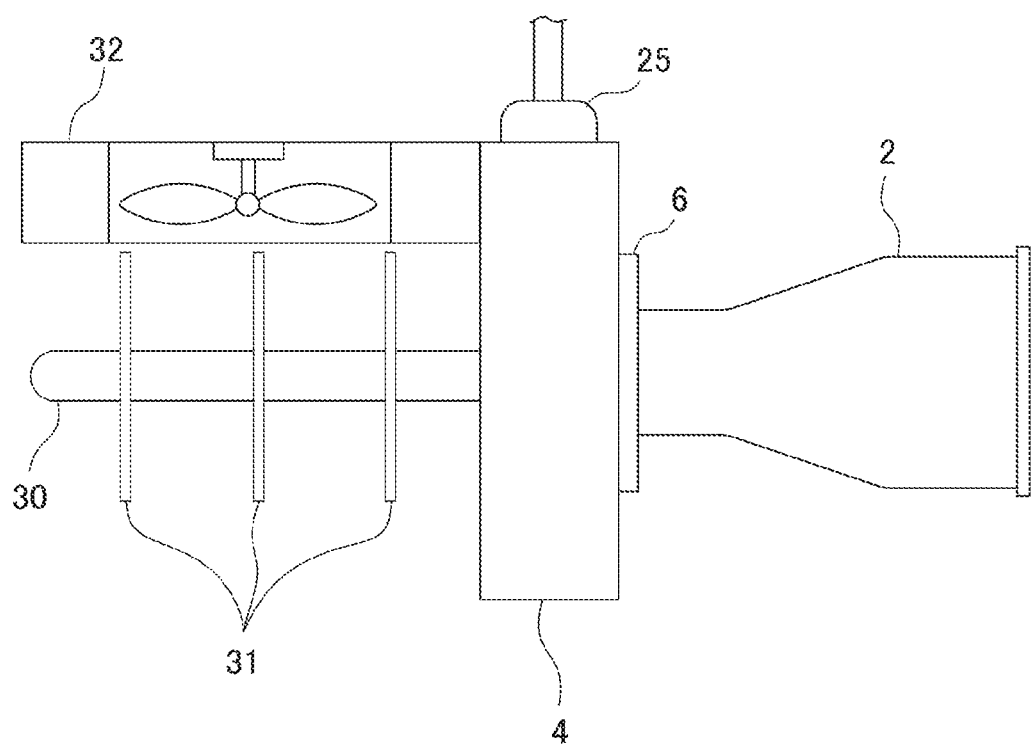
FIG. 7 is a side view of a modification of the second embodiment of the present invention.

FIG. 7 illustrates a modification of the embodiment using the heat pipe 30. In this modification, thin-plate fins 31 are fitted to the heat pipe 30 to enhance heat radiation effect. Further, by providing a fan 32 that forms an air flow in the direction perpendicular to the direction in which the surfaces of respective fin 31 face, heat exchange by the fins 31 is made more effective.

Third Embodiment

Figure 8:
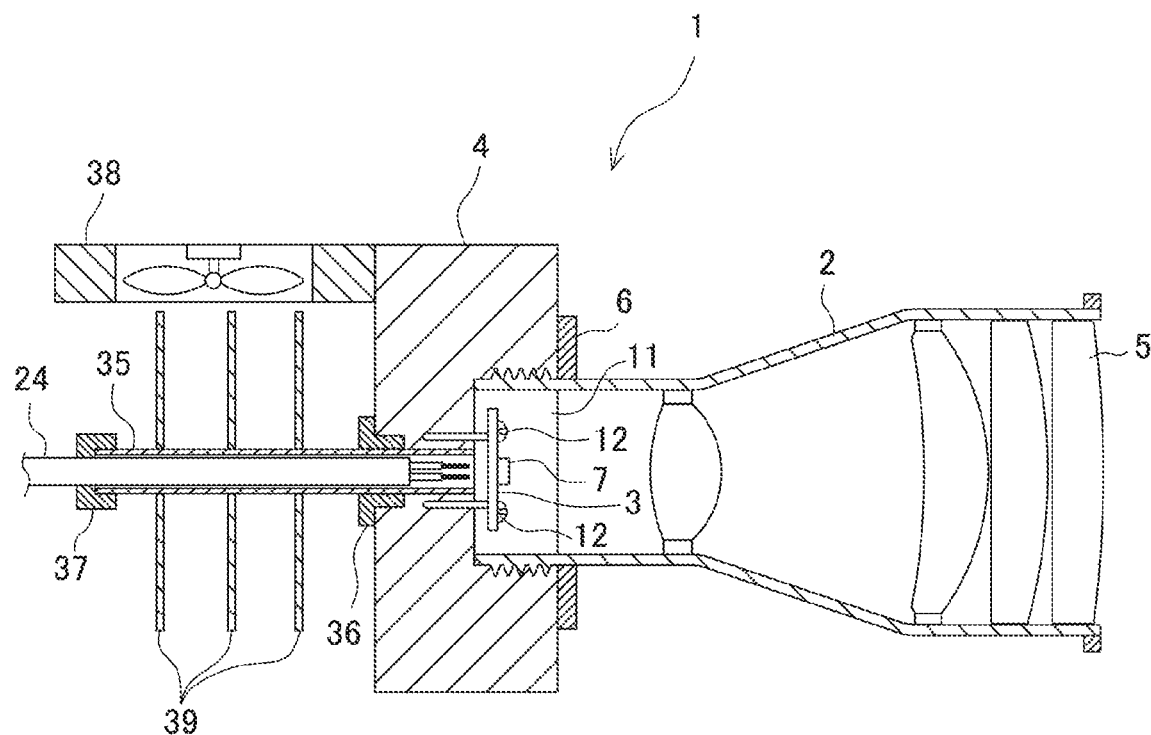
FIG. 8 is a side view of an LED lighting apparatus according to a third embodiment.

FIG. 8 is a side cross-sectional view of an LED lighting apparatus 1 according to a third embodiment. The same reference numerals are given to the same elements, and overlapping description will be omitted.

Unlike the base part 4 of the first embodiment, the base part 4 in this third embodiment has neither the receiving port 13 for receiving the externally inserted harness 24 nor the path 26 formed inside thereof and, instead, the harness 24 is made to pass through a wire pipe penetrating the base part 4 from the back surface thereof toward the concave part 11 to be connected to the LED package 7. The pipe 35 is made of metal or resin and is most preferably a copper pipe having high heat conductivity. The insertion end of the harness 24 in the pipe 35 and the insertion part of the pipe 35 in the base part 4 are closed by grommets 36 and 37, respectively, to thereby seal the lens casing 2.

As in the case where the heat radiating columns 16 of the first embodiment, heat transmitted from the LED package 7 to the base part 4 is further transmitted to the pipe 35, exchanged with air, and exhausted to the atmosphere. In the third embodiment as well, by fitting fins 39 to the pipe 35 and providing a fan 38, heat radiation effect is enhanced.

The present invention is not limited to the above embodiments, but may be variously modified according to the spirit of the present invention, and the various modifications are not excluded from the scope of the present invention.

What is claimed is:

1. An LED lighting apparatus comprising:
    a tubular lens casing that has a first end face at which lighting lenses are provided and a second end face;
    a substrate on which LED elements are mounted;
    a base part provided at the second end face of the lens casing;
    a concave part formed in a surface of the base part facing the second end face of the lens casing so as to house the substrate;
    a coupling part that holds a coupling state between the lens casing and the base part by fitting the lens casing to the concave part at the second end face to seal an internal space of the lens casing;
    at least four heat radiating columns formed so as to protrude from a back surface of the base part to an outside space in a direction opposite to the tubular lens casing, and arranged on the back surface circumferentially apart from each other to form each of window parts between the at least four heat radiating columns adjacent to each other; and
    screws that fix the substrate to a bottom surface of the concave part and having leading ends that penetrate through the bottom surface of the concave part so as to protrude from the back surface of the base part inside the at least four heat radiating columns and the window parts to be exposed to air in the outside space.

2. The LED lighting apparatus according to claim 1, further comprising
    a heat pipe formed so as to protrude from the back surface of the base part at a position opposed to a terminal part of the LED elements in the base part to be exposed to air in the outside space.

3. The LED lighting apparatus according to claim 2, wherein fins are fitted to the heat pipe.

4. The LED lighting apparatus according to claim 1, further comprising
    a fan with a frame supported by the at least four heat radiating columns, wherein the frame is opposed to the back surface of the base part and spaced therefrom so as to form the window parts by the adjacent heat radiating columns as side frames thereof and by opposed sides of the frame and the base part as upper and lower frames thereof, and to form an air flow path communicating between the fan and the window parts through a space between the frame and the base part.

5. The LED lighting apparatus according to claim 4, wherein the fan is an axial flow type fan having an impeller to blow air from outside in the axial direction thereof, and the air flow path is adapted to flow air from the impeller directly toward the back surface of the base part and the leading end portions of the screws protruding from the back surface and to be exhausted through the window parts.

6. The LED lighting apparatus according to claim 5, wherein the fan is reversely rotatable so that air from outside flows through the window parts toward the fan in the air flow path.

7. The LED lighting apparatus according to claim 1, wherein the at least four heat radiating columns are arranged on the back surface at the periphery thereof circumferentially apart from each other.

8. The LED lighting apparatus according to claim 7, wherein the at least four heat radiating columns include four heat radiating columns each arranged at four corners of the rectangular back surface of the base part.

* * * * *